United States Patent
Schimmel et al.

(10) Patent No.: US 8,711,325 B2
(45) Date of Patent: Apr. 29, 2014

(54) METHOD AND SYSTEM FOR DETERMINING A SUPPRESSION FACTOR OF A SUPPRESSION SYSTEM AND A LITHOGRAPHIC APPARATUS

(75) Inventors: Hendrikus Gijsbertus Schimmel, Utrecht (NL); Tjarko Adriaan Rudolf Van Empel, Eindhoven (NL); Hans Johannes Maria Freriks, Veldhoven (NL); Yuri Johannes Gabriël Van De Vijver, Best (NL); Gerardus Hubertus Petrus Maria Swinkels, Eindhoven (NL); Marc Antonius Maria Haast, Eindhoven (NL); Wendelin Johanna Maria Versteeg, Eindhoven (NL); Peter Gerardus Jonkers, Eindhoven (NL); Dzmitry Labetski, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 667 days.

(21) Appl. No.: 12/742,009

(22) PCT Filed: Nov. 6, 2008

(86) PCT No.: PCT/NL2008/050700
§ 371 (c)(1), (2), (4) Date: Oct. 25, 2010

(87) PCT Pub. No.: WO2009/061188
PCT Pub. Date: May 14, 2009

(65) Prior Publication Data
US 2011/0261329 A1    Oct. 27, 2011

Related U.S. Application Data

(60) Provisional application No. 60/996,281, filed on Nov. 8, 2007.

(51) Int. Cl.
*G03B 27/52* (2006.01)

(52) U.S. Cl.
USPC ............................................... 355/30

(58) Field of Classification Search
USPC ......................................... 355/30, 53
See application file for complete search history.

(56) References Cited

U.S. PATENT DOCUMENTS

| | | |
|---|---|---|
| 6,198,792 B1 | 3/2001 | Kanouff et al. |
| 6,714,624 B2 | 3/2004 | Fornaciari et al. |
| 6,919,573 B2 | 7/2005 | Roux |

(Continued)

FOREIGN PATENT DOCUMENTS

| | | |
|---|---|---|
| EP | 0 676 672 | 10/1995 |
| JP | 2004-289151 | 10/2004 |

(Continued)

OTHER PUBLICATIONS

International Search Report of PCT/NL2008/050700.

(Continued)

*Primary Examiner* — Toan Ton
*Assistant Examiner* — Chia-how Michael Liu
(74) *Attorney, Agent, or Firm* — Pillsbury Winthrop Shaw Pittman LLP (57) ABSTRACT

The invention relates to a method for determining a suppression factor of a suppression system. The suppression system is arranged to suppress migration of a contaminant gas out of a first system. The suppression factor is an indication of the performance of the suppression system. The method includes introducing a tracer gas in the sub-system, providing a detection system configured to detect the amount of tracer gas that has migrated out of the first system, determining a first suppression factor for the suppression system for the tracer gas. The method further includes determining a second suppression factor for the suppression system for the contaminant gas based on the first suppression factor.

22 Claims, 6 Drawing Sheets

(56) References Cited

U.S. PATENT DOCUMENTS

| | | | |
|---|---|---|---|
| 7,479,645 | B2 | 1/2009 | Yabuta et al. |
| 7,504,643 | B2 | 3/2009 | Freriks et al. |
| 7,684,012 | B2 | 3/2010 | Jacobs et al. |
| 2003/0053594 | A1 | 3/2003 | Fornaciari et al. |
| 2004/0023419 | A1 | 2/2004 | Kishkovich et al. |
| 2004/0183030 | A1 | 9/2004 | Roux |
| 2006/0268246 | A1 | 11/2006 | Jacobs et al. |
| 2007/0018119 | A1 | 1/2007 | Yabuta et al. |
| 2007/0145297 | A1 | 6/2007 | Freriks et al. |

FOREIGN PATENT DOCUMENTS

| | | |
|---|---|---|
| JP | 2005-503657 | 2/2005 |
| JP | 2006-000760 | 1/2006 |
| JP | 2007-035660 | 2/2007 |

OTHER PUBLICATIONS

Japanese Office Action mailed Nov. 20, 2012 in corresponding Japanese Patent Application No. 2010-533020.

Taiwan Office Action dated Jan. 14, 2013 in corresponding Taiwan Patent Application No. 097143237.

METHOD AND SYSTEM FOR DETERMINING A SUPPRESSION FACTOR OF A SUPPRESSION SYSTEM AND A LITHOGRAPHIC APPARATUS

CROSS-REFERENCE TO RELATED APPLICATIONS

This is the U.S. National Stage of PCT/NL2008/050700, filed Nov. 6, 2008, which in turn claims priority to U.S. Provisional Application No. 60/996,281, filed Nov. 8, 2007, the entire contents of both applications are incorporated herein by reference.

FIELD

The present invention relates to a method for determining a suppression factor of a suppression system, a system for performing such a method and a lithographic apparatus including such a system. The invention further relates to a computer program and a data carrier including such a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In currently available lithographic devices, the employed radiation is generally ultra-violet (UV) light, which may be derived from an excimer laser or mercury lamp, for example; many such devices use UV light having a wavelength of 365 nm or 248 nm. However, the rapidly developing electronics industry continually demands lithographic devices which can achieve ever-higher resolutions, and this is forcing the industry toward even shorter-wavelength radiation, particularly UV light with a wavelength of 193 nm or 157 nm. Beyond this point there are several possible scenarios, including the use of extreme UV light (EUV: wavelength 50 nm and less, e.g. between 13 and 14 nm or 11 nm), X-rays, ion beams or electron beams. All of these so-called next-generation radiations undergo absorption in air, so that it becomes desirable to at least partially evacuate the environment in which they are employed. This may be difficult.

A general discussion of the use of EUV in lithographic projection apparatus may be found, for example, in the article by J. B. Murphy et al. in Applied Optics 32 (24), pp 6920-6929 (1993). Similar discussions with regard to electron-beam lithography may be found in U.S. Pat. No. 5,079,112 and U.S. Pat. No. 5,260,151, as well as in EP-A 98201997.8.

An EUV lithograph apparatus is usually formed by a number of sub-systems, such as a source sub-system, e.g. including an EUV source,
an illumination sub-system, e.g. including an illuminator,
a support structure sub-system, e.g. including a mask table,
a projection sub-system, e.g. including a refractive projection system and
a substrate table sub-system, e.g. including a substrate table or wafer table.

In order to improve the quality of a lithographic apparatus, it is desirable to manage contamination carefully. In order to prevent contamination from migrating through the lithographic apparatus, gas locks may be used. Gas locks may suppress the migration of contamination by providing a counter-flow of gas.

Gas locks may be used to suppress contamination from migrating from one sub-system to another sub-system. Also, gas locks may be used to suppress contamination from migrating from one place (first mini environment) to another (second mini environment) within a sub-system.

According to an example, the substrate table sub-system is separated from the projection sub-system by a gas lock. Such a gas lock is designed to suppress unwanted gas species from migrating from the substrate table sub-system to the projection sub-system. The gas lock is arranged to suppress this migration with a certain suppression factor. According to this example, the gas lock may be arranged to suppress hydrocarbons coming from a substrate W by using a counterflow of hydrogen.

Furthermore, a gas lock may be used to separate the source sub-system (which may contain an aggressive chemical to clean the source mirror as a contaminant) from the illumination sub-system.

So, gas locks are provided to suppress contamination from migrating out of a sub-system, i.e. moving from one part to another part within a system. It will be understood that also other suppression systems may be used and that a gas lock is just an example of a possible suppression system. Other mechanisms to suppress contamination include cross flows (i.e. a gas lock where the gas flow is directed perpendicular to the direction of the movement of the contaminant), suppression systems using electric, magnetic, gravitational or other force fields, or using temperature, pressure and/or force (for instance in a centrifuge) gradients. In fact, traditional locks (formed by two subsequent doors) may be considered a suppression system as locks are also provided to prevent contamination from migrating.

For some contamination gasses present in the source sub-system (e.g. aggressive chemicals to clean the source mirror or contaminating chemicals like heavy hydrocarbons), the maximum allowable concentrations in the illumination sub-system and projection sub-system are relatively low. The specified maximum partial pressures of the contaminant is often much lower than feasible detection limits.

This may cause problems when the maximal allowable amount of contaminant leaking through the suppression system is below the amount that is detectable using an available detection system. This may result in problematic qualification of the suppression system and/or monitoring of the suppression system, as explained in the paragraphs below.

This may be problematic when one needs to qualify a design and the performance of a suppression system. The performance of the suppression system may not be qualified as the amount of contaminant that is possibly leaking through the suppressor may not be detected. For instance, when a gas lock is used as a suppression system, the amount of allowable contaminant may not be detected 'upstream' of the gas lock.

Furthermore, the performance of the suppression system may not be checked during operation. A possible defect in the suppression system may not be detected because the specification may not be measured with sufficient accuracy. For instance, when a gas lock is used as a suppression system and, as an error, the counter flow is only half the desired counter flow, this may not be detected 'upstream' of the counter flow, as the amount of contaminant leaking through is not high enough to be detected, although high enough to damage the system. Also, before the supply of an aggressive chemical is opened, it is desirable to ensure that the suppression system is working properly.

SUMMARY

According to an aspect of the invention, there is provided a method for determining a suppression factor of a suppression system, where the suppression system is arranged to suppress migration of a contaminant gas out of a first system, e.g. a sub-system of a system, the suppression factor being an indication of the performance of the suppression system, the method including introducing a tracer gas in the first system, e.g. the sub-system, providing a detection system configured to detect the amount of tracer gas that has migrated out of the first system, e.g. the sub-system, determining a first suppression factor for the suppression system for the tracer gas, and determining a second suppression factor for the suppression system for the contaminant gas based on the first suppression factor.

According to a further aspect of the invention, there is provided a system including a first system, e.g. a sub-system, and a suppression system arranged to suppress migration of a contaminant gas out of the first system, e.g. the sub-system, the suppression system having a suppression factor being an indication of the performance of the suppression system, the system further including a tracer gas supply configured to introduce a tracer gas in the first system, e.g. the sub-system, a detection system configured to detect the amount of tracer gas that has migrated out of the first system, e.g. the sub-system, and a control unit configured to determine a first suppression factor for the suppression system for the tracer gas and to determine a second suppression factor for the suppression system for the contaminant gas based on the first suppression factor.

According to a further aspect of the invention, there is provided a lithographic apparatus including a first system, e.g. a sub-system, and a suppression system arranged to suppress migration of a contaminant gas out of the first system, e.g. the sub-system, the suppression system having a suppression factor being an indication of the performance of the suppression system, the apparatus further including a tracer gas supply configured to introduce a tracer gas in the first system; a detection system configured to detect an amount of tracer gas that has migrated out of the first system; and a control unit configured to determine a first suppression factor for the suppression system for the tracer gas and to determine a second suppression factor for the suppression system for the contaminant gas based on the first suppression factor, wherein the suppression system is provided to prevent migration of the contaminant gas to a second system of the lithographic apparatus.

According to a further aspect of the invention, there is provided a computer product having machine executable instructions, the instructions being executable by a machine to perform a method for determining a suppression factor of a suppression system, the suppression system arranged to suppress migration of a contaminant gas out of a first system, the suppression factor being an indication of the performance of the suppression system, the method including introducing a tracer gas in the first system; detecting an amount of tracer gas that has migrated out of the first system using a detection system; determining a first suppression factor for the suppression system for the tracer gas; and determining a second suppression factor for the suppression system for the contaminant gas based on the first suppression factor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
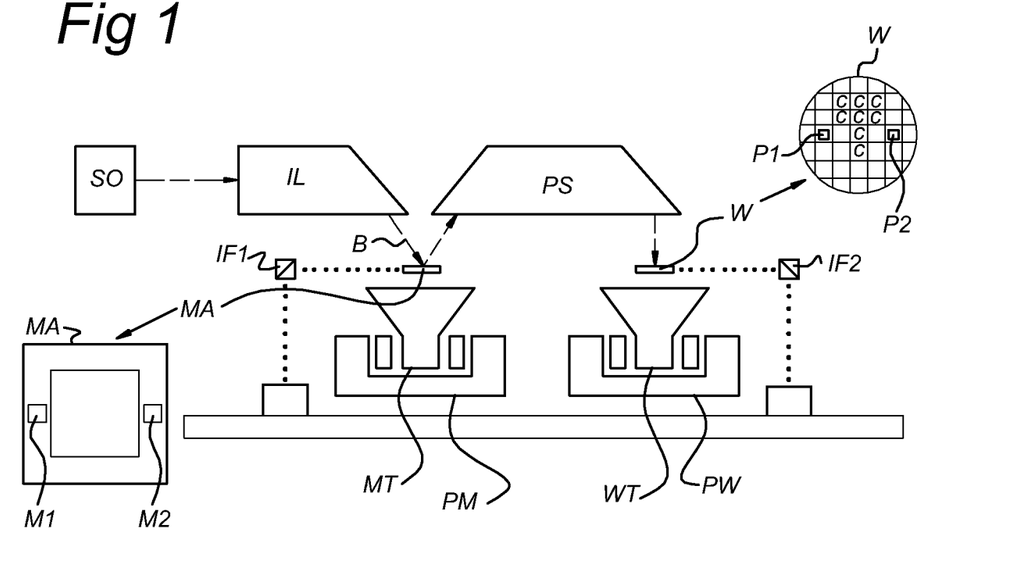
FIGS. 1 and 2 schematically depict a lithographic apparatus in accordance with an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure or patterning device support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by a patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure or patterning device support (e.g., mask table) MT, and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the patterning device support or support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support or support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support or support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support or support structure (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support or support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support or support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
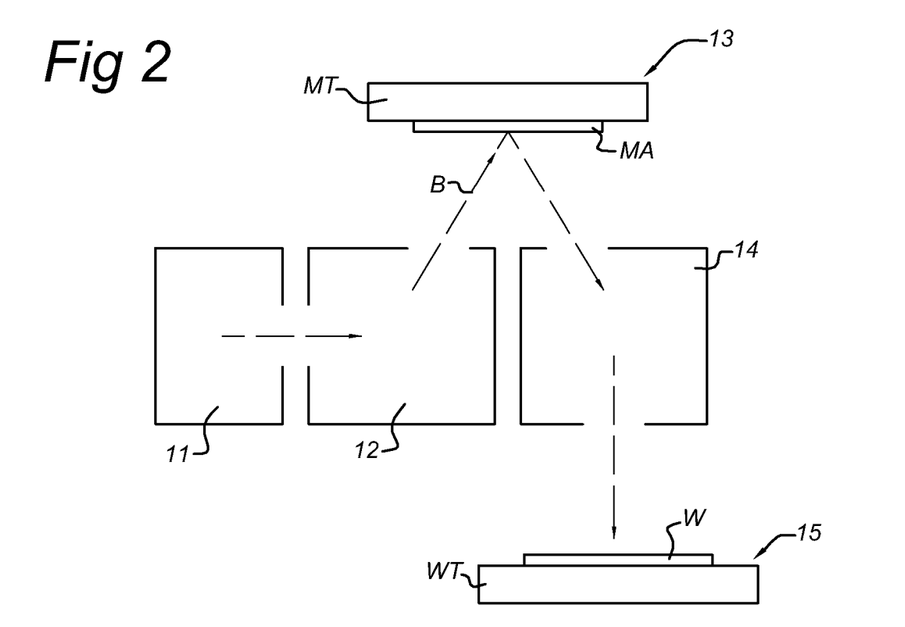

FIG. 2 shows a schematic version of the apparatus of FIG. 1 in accordance with an embodiment of the invention. FIG. 2 shows a lithographic apparatus including a source sub-system 11, e.g. including an EUV source (not shown), an illumination sub-system 12, e.g. including an illuminator IL (not shown), a support structure sub-system 13, e.g. including a support structure or patterning device support (e.g. mask table) MT with a patterning device (e.g. mask) MA, a projection sub-system 14, e.g. including a refractive projection lens system PS (not shown) and a substrate table sub-system 15, e.g. including a substrate table or wafer table WT with a substrate or wafer W.

In a lithographic apparatus using EUV radiation, suppression systems to suppress contamination from migrating through the lithographic apparatus may be provided, for instance from a first system, e.g. one sub-system, to a second system, e.g. another sub-system. An example of such a suppression system is a gas lock, which is described in more detail with reference to FIG. 3.

Figure 3:
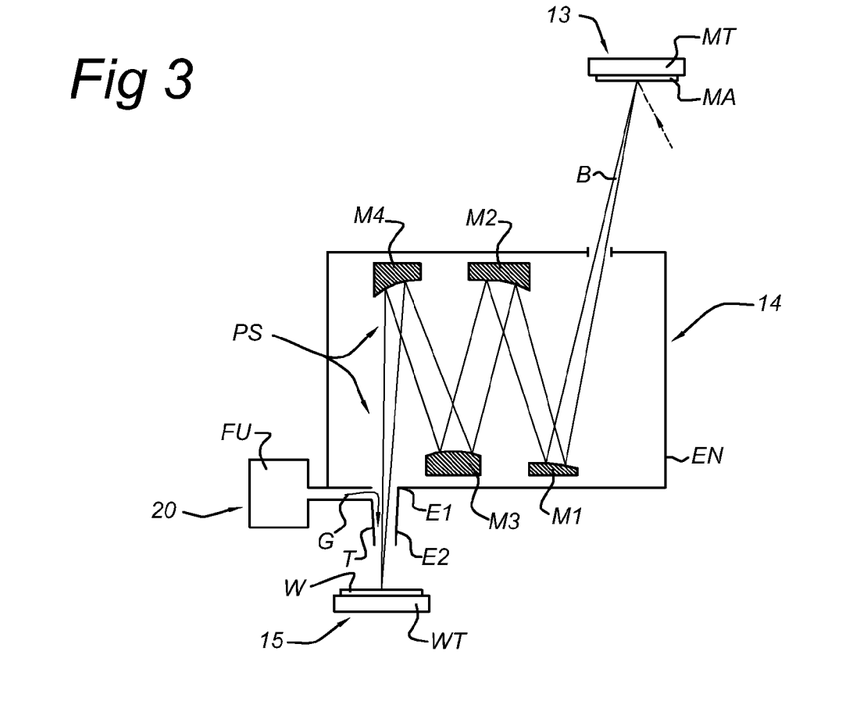
FIG. 3 schematically depicts a projection sub-system with a suppression system in accordance with an embodiment of the invention.

FIG. 3 schematically depicts a projection sub-system 14 in accordance with an embodiment. The projection sub-system 14 is arranged to receive a patterned radiation beam B from a support structure sub-system 13 supporting patterning device (e.g. mask) MA and project the radiation beam to a substrate W included in a substrate table sub-system 15. To properly project the radiation beam B, the projection sub-system 14 includes a projection system PS, including a plurality of mirrors M1, M2, M3, M4. It will be appreciated that the projection system PS as shown here is just an example of a possible projection system.

As shown in FIG. 3, further provided is a suppression system 20 to suppress contamination from migrating from the substrate table sub-system 15 to the projection sub-system 14. The suppression system 20 is here provided as a gas lock.

The gas lock is provided by providing a hollow tube T positioned in an intervening space delimited by the "final" mirror M4 in the projection sub-system 14 and the substrate W in the substrate table sub-system 15. The tube T is positioned around the path of the radiation beam B on its way from the final mirror M4 to the substrate W or substrate table WT (in case no substrate is present). This tube T is formed, sized and positioned in such a way its walls do not intercept the radiation beam B. In this particular embodiment, the tube T is embodied as a continuation of an enclosure EN enclosing the projection sub-system 14 and the tube T is projecting outward from the enclosure EN.

According to this example, the tube T contains a gas which does not substantially absorb EUV, e.g., Ar or Kr. This gas may be flushed through the tube T in the direction of the substrate W. This may be achieved, for example, by using a flushing unit FU to introduce a downward flow of the gas G into the tube T in proximity to its top rim (E1) or at some point (E2) between its top and bottom rims; in the case of introduction at such a latter intermediate point (E2), part of the flow may be downward and part may be upward, for example.

Figure 4:
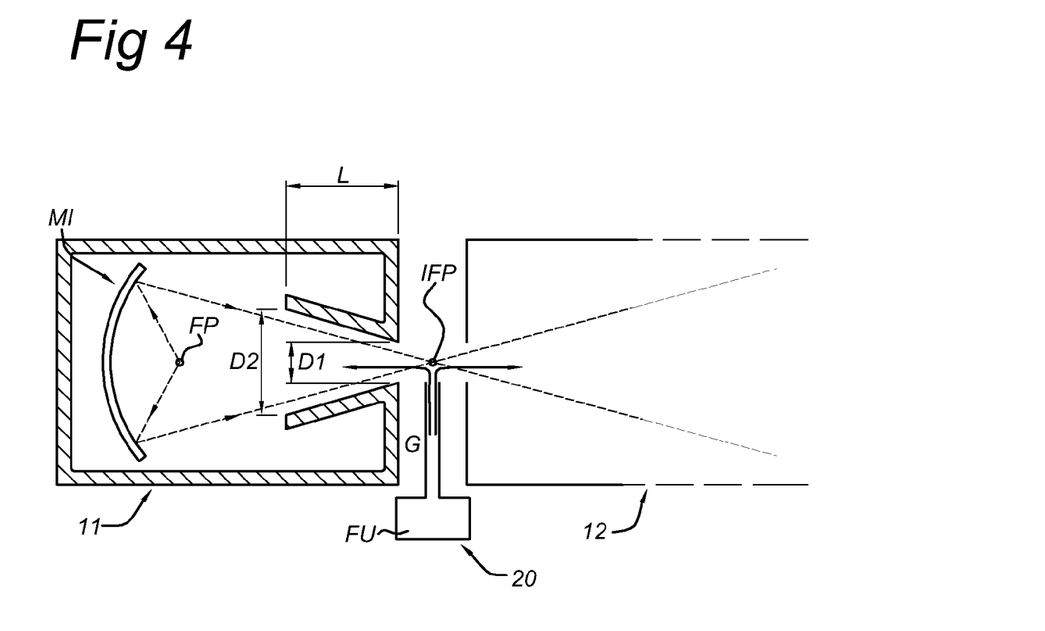
FIG. 4 schematically depicts a source sub-system with a suppression system in accordance with an embodiment of the invention.

FIG. 4 schematically depicts a suppression system in the form of a gas lock that may be used to suppress contaminants from traveling from the source sub-system 11, e.g. including an EUV source, to a neighboring sub-system, such as the illumination sub-system 12.

FIG. 4 shows a source sub-system 11 including a EUV source having a first focal point FP in which the radiation beam B is generated. The radiation B is focused in an intermediate focal point IFP by a curved shaped mirror MI. The radiation beam B travels from the source sub-system 11 into the illumination sub-system 12.

As shown in FIG. 4, near the exit of the source sub-system 11, the source sub-system 11 includes a conical shaped structure that substantially follows the contour of the radiation beam B. The conical shaped structure has a length L and a first diameter D1 at the location of the exit of the source sub-system 11 and a second diameter D2 at the side of the conical shaped structure facing the first focal point FP.

Again, a suppression system 20 is provided to suppress migration of contaminants from source sub-system 11 to illumination sub-system 12. The suppression system 20 is here provided as a gas lock. Examples of contaminants that may be present in the source sub-system are HI, $SnH_4$, $SnBr_4$, $SnBr_2$ that may be used as a working gas in EUV sources using Sn.

The gas lock is provided by providing a hollow tube T. The tube is positioned such that it ends close to the position where the radiation beam B exits the source sub-system 11 and enters the illumination sub-system 12. The tube T is such that it does not intercept the radiation beam B. According to this example, the tube T contains a gas which does not substantially absorb EUV, e.g., Ar, Kr, He or $H_2$. This gas may be flushed through the tube T in the direction of the source sub-system 11. This may be achieved, for example, by using a flushing unit FU to introduce a flow of the gas G into the tube T and thereby generating a counterflow into the source sub-system 11 (and illumination sub-system 12) as indicated with the double arrows.

Gas locks are designed to generate a flow of a harmless gas (e.g. not interfering with the radiation beam B) that counteracts the migration of contaminants. The migration of contaminants is usually driven by a concentration gradient and is described as a diffusion process. So, generally speaking, the convection of the gas lock gas needs to be equal to or greater than the diffusion of the contaminant. The ratio of convection and diffusion is expressed using the dimensionless Péclet number, which for mass diffusion is defined as:

$$Pe' = \frac{vL}{D}$$

wherein
Pé: Péclet number
v: characteristic velocity of the gas lock gas
L: characteristic length, an
D: diffusion coefficient of the contaminant in the gas lock gas at the pressure of the gas lock gas.

For the conical shaped structure described above with reference to FIG. 4, the Péclet number reads:

$$Pe' = \frac{Q}{p \cdot D} \cdot \frac{4 \cdot L}{\pi \cdot D1 \cdot D2}$$

wherein
Pé: Péclet number,
Q: flow of the gas lock gas through cone in the unit [Pa m$^3$/s]
p: pressure in the cone (does not need to be specified because the product of the pressure p and the diffusion coefficient D is constant in a very good approximation)
D1: first diameter D1 of the conical shaped structure,
D2: second diameter D2 of the conical shaped structure,
L: characteristic length of the conical shaped structure, and
D: diffusion coefficient of the contaminant in the gas lock gas at pressure p.

The efficiency of the suppression system is expressed as a suppression factor S. In case the suppression system is a gas lock being characterized by the Péclet number (which is at least the case for a one dimensional flow), the suppression factor S is defined as: $S = e^{Pé}$.

Alternative suppression methods may be described in a similar way. Generally speaking, an alternative suppression system is based on a driving force that is acting on the contaminant particles. This driving force may then counteract the diffusion of the contaminant, for instance by keeping the contaminant particles in the contaminated area and thus away from the area that needs to be protected from the contaminants. Also, the driving force may be applied such that it is not parallel to the direction from the clean area to the contaminated area. In the latter case, the contaminant particles may be forced to an area where they may be extracted, absorbed or in another way be taken away or converted into non contaminating particles.

In these alternative cases the suppression effect arises due to the balance between the diffusion of the particles and the driving force acting on them.

As described above, other suppression systems may be used as well, for instance suppression systems including a cross flow (i.e. a gas lock where the gas flow is directed perpendicular to the direction of the movement of the contaminant), suppression systems using electric, magnetic, gravitational or other force fields, or using temperature, pressure and/or force (for instance in a centrifuge) gradients. In fact, also a (load) lock may be considered a suppression system as locks are also provided to prevent contamination from migrating.

Detection systems are known to a skilled person and may be used to detect if contaminants are migrating from the first sub-system and if so, to measure how much contaminant is migrating from the first sub-system.

Detection systems may include at least one of a partial pressure analyzer (residual gas analyzer), chemical probe, or may one of the following techniques: radiation produced by an isotope, adsorption spectra (radio waves, IR, visible, UV, DUV, EUV, X-Ray), nuclear magnetic resonance. However, other suitable detection systems may also be used.

However, as stated above, for some contaminants (e.g. aggressive chemicals to clean the source mirror or contaminating chemicals like heavy hydrocarbons) the maximum allowable concentrations in the illuminator sub-system 12 relatively extremely low, i.e. not detectable by the available detection systems. This may result in problematic qualification of the suppression system and/or monitoring of the suppression system.

In an embodiment provided here, a suppression system is provided to suppress migration of a contaminant from a first system, e.g. a sub-system, to a second system, e.g. another sub-system, and it is proposed to introduce a tracer gas in the first system. The tracer gas may be used to qualify and/or check the performance of the suppression system. The results obtained with respect to the tracer gas may be used to determine the performance of the suppression system for the contaminant.

The tracer gas may be a gas that has a higher diffusion coefficient than the contaminant: $D_{tracer} > D_{cont}$, thus: $Pé_{tracer} < Pé_{cont}$, and thus $S_{tracer} < S_{cont}$. So, in case the suppression system works well for the tracer gas, one can be sure that it also works well for the contaminant.

The tracer gas may be better detectable by a detection system than the contaminant. Some gases are better detectable by a detection system then other gases. The detectability of a gas may be given by Se and may be defined as the minimal partial pressure that is detectable. The minimal partial pressure may vary with the total pressure.

By using a tracer gas that is better detectable than the contaminant, the suppression system may be qualified and/or monitored based on the tracer gas.

The tracer gas may for instance be better detectable because a better detection system is available for that type of gas. So, it is ensured that the detection range of the tracer partial pressure is larger than the detection range of the contaminant.

The upper limit of the detection range may be present by design (i.e. a known flow in a chamber with a known pumping capacity results in a partial pressure that, though not measurable, can be calculated with high accuracy from the design parameters).

According to an embodiment, a tracer gas may be selected based on a combination of the two properties mentioned above: diffusion coefficient (compared to the diffusion coefficient of the contaminant) and detectability (compared to the detectability of the contaminant). For example, for a mass spectrometer the detectability $Se_i$ for specie i may be defined as:

$$Se_i \equiv \frac{I_i - I_{i,background}}{P_i}$$

where $I_{i,background}$ is the background current for the mass of interest, $I_i$ is the current that appears because the partial pressure of i-gas is increased by $P_i$. There is some minimal value of the current that can be detected by the analyzer, which results into the minimal detectible values of the partial pressure for different gases.

Another possible definition of the detectability is:

$$Se_i \equiv \frac{I_i(P_i) - I_{i,background}}{I_{i,background}}$$

using the same symbols as above. The latter definition emphasizes the signal to noise ratio (or signal to background ratio). Other definitions of the detectability may be applicable, depending on for instance the type of gas, the working principle of the sensor and the actual configuration of the sensor. Which definition should be used for the detectability follows from an analysis by the skilled person, taking factors such as given above into account.

In general, after choosing a definition of the detectability, one may choose a suitable tracer gas based on the following inequality:

$$D_{tracer} \cdot Se_{tracer} > D_{cont} \cdot Se_{cont}$$

Thus, a tracer gas having substantially the same diffusion coefficient (and thus substantially the same suppression ratio) as the contaminant, but being detectable at very low levels is as good as a tracer gas having a relatively low suppression ratio and a relatively good detection range. In general, the choice of a tracer gas may be based on the difference in suppression factor of the tracer gas with respect to the contaminant and on the difference in detectabilities of the chosen measurement apparatus between the tracer gas and the contaminant. Further, it will be appreciated that such a balance between the properties that determine the suppression factors for the tracer gas and the contaminant and the detectabilities for the tracer gas and the contaminant determines the choice of the tracer gas for migration barriers that use other mechanism to suppress migration than a counter flow.

The suppression of the tracer gas by the gas lock or other suppression system may have a minimal value. For example, say that a certain contaminant is suppressed by a factor of $10^{10}$. One has found a tracer gas that has a very high diffusion coefficient and a very good detectability. The tracer gas is only suppressed by a factor of 1.01. In this example, one may lack accuracy of the measurement apparatus to distinguish between the value of the tracer gas when no suppression at all takes place and the situation that the suppression is good enough, since these two situations only give a 1% difference in the readout of the sensor (due to the extremely low suppression of the tracer gas). It may therefore be that the choice of a tracer gas is limited by a minimum suppression of the tracer gas, so as to achieve a reasonable accuracy. In a typical example, one may think of a minimum suppression of the tracer gas of a factor of 100. This larger factor (compared to 1.01 in the previous situation) may give a more accurate answer to the question whether the suppression mechanism functions properly or not.

The tracer gas may be a gas that does not interfere with the rest of the first and/or second sub-system and/or total system. The gas may for instance be a gas that is already present as such in the first sub-system, second sub-system and or total system. So, in case the sub-system is a source sub-system 11, the gas may be a noble gas like Helium or Neon.

Isotopes of gases that are already used in the first, second and/or total system may also be used. In case the first sub-system is a source sub-system, the tracer gas may be hydrogen enriched with deuterium or tritium.

The suppression in the existing gas lock may be higher than the suppression of the chemical the gas lock is designed for. This translates in a higher diffusion coefficient of the tracer gas than the contaminant gas.

Figure 5:
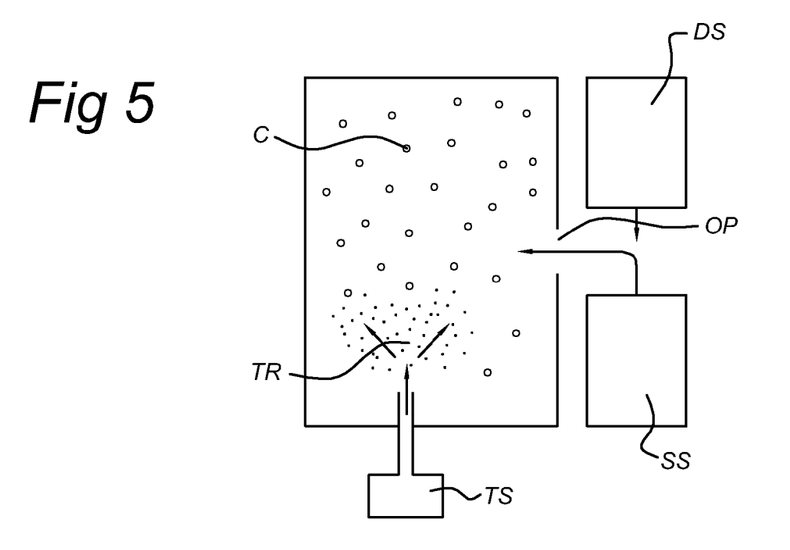
FIG. 5 schematically depicts a sub-system according to an embodiment of the invention.

FIG. 5 shows an embodiment showing a sub-system including a contaminant gas C. As can be seen in FIG. 5, the sub-system includes an opening OP, through which the contaminant gas may exit. To prevent this, a suppression system SS is provided to suppress migration of the contaminant gas out of the sub-system. The suppression system SS may be a gas-lock providing a counter flow of gas into the suppression system. The suppression system has a suppression factor being an indication of the performance of the suppression system. Further provided is a tracer gas TS supply configured to introduce a tracer gas TR in the sub-system.

FIG. 5 further shows a detection system DS configured to detect tracer gas migrating out of the sub-system. Based on the amount of detected tracer gas TR, a first suppression factor for the suppression system for the tracer gas may be determined. This first suppression factor may be used to determine a second suppression factor for the suppression system for the contaminant gas based on the first suppression factor. A control unit (not shown in FIG. 5) may be provided to determine the first and/or second suppression factor.

So, there is provided a system including at least one sub-system and a suppression system arranged to suppress migration of a contaminant gas out of the sub-system, the suppression system having a suppression factor being an indication of the performance of the suppression system, the system further including a tracer gas supply configured to introduce a tracer gas in the sub-system, a detection system configured to detect the amount of tracer gas that has migrated out of the sub-system, and a control unit configured to determine a first suppression factor for the suppression system for the tracer gas and to determine a second suppression factor for the suppression system for the contaminant gas based on the first suppression factor.

The tracer gas TR may have a diffusion coefficient that is greater than the diffusion coefficient of the contaminant gas: $D_{tracer} > D_{cont}$. The tracer gas TR may also be better detectable by the detection system than the contaminant gas: $Se_{tracer} > Se_{cont}$. In combination, the following relation may be valid:

$$D_{tracer} \cdot Se_{tracer} > D_{cont} \cdot Se_{cont}$$

The tracer gas TR may be a noble gas. The tracer gas may be formed by isotopes of gases that are already present in the sub-system and may be one of the group including: hydrogen enriched with deuterium or tritium. Such tracer gases TR have little interference with the sub-system, especially when the sub-system is a source sub-system 11, including an EUV-source.

The system may very well be employed in a lithographic apparatus. Accordingly, there is provided a lithographic apparatus including a system, wherein the system includes at least one sub-system and a suppression system arranged to suppress migration of a contaminant gas out of the sub-system, the suppression system having a suppression factor being an indication of the performance of the suppression system, the system further including a tracer gas supply configured to introduce a tracer gas in the sub-system, a detection system configured to detect the amount of tracer gas that has migrated out of the sub-system, and a control unit configured to determine a first suppression factor for the suppression system for the tracer gas and to determine a second suppression factor for the suppression system for the contaminant gas based on the first suppression factor, wherein the suppression system is provided to prevent migration of the contaminant gas to a further sub-system of the lithographic apparatus.

According to an embodiment, the sub-system is a source sub-system 11 and the further sub-system is an illumination sub-system 12. According to a further embodiment, the sub-system is a projection sub-system 14 and the second sub-system is a substrate table sub-system 15.

Examples of this are further explained below with reference to FIGS. 6 and 7.

Figure 6:
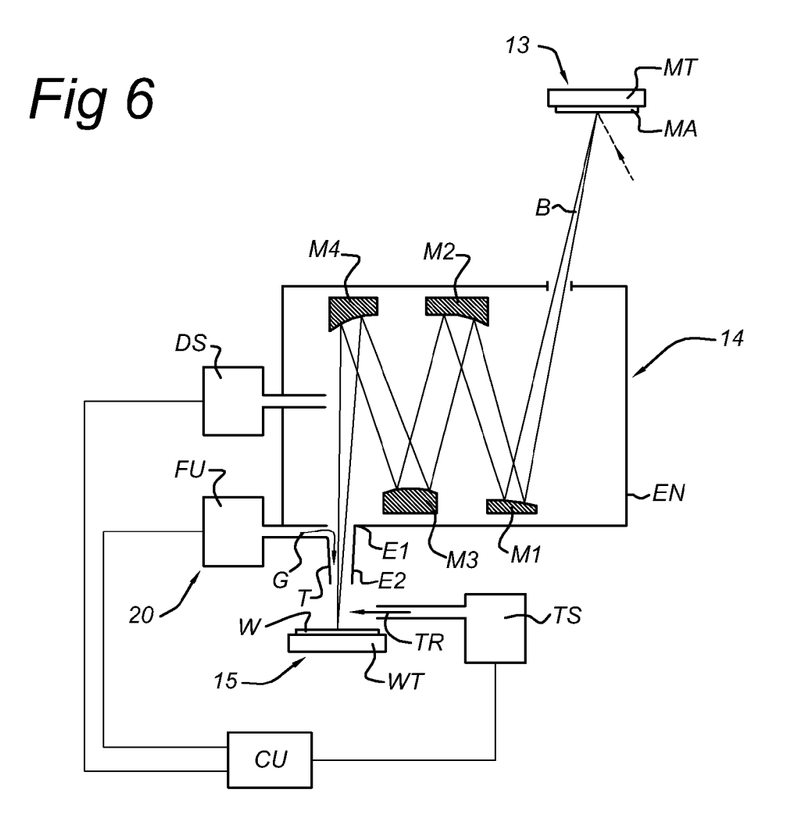
FIG. 6 schematically depicts a projection sub-system with a suppression system according to an embodiment of the invention.

FIG. 6 schematically depicts a projection sub-system 14 and a substrate table sub-system 15, similar to FIG. 3, in which corresponding reference symbols indicate corresponding parts.

FIG. 6 further includes a tracer gas supply TS configured to introduce a tracer gas TR in the substrate table sub-system 15. FIG. 6 further shows a detection system DS configured to detect the amount of tracer gas that has migrated out of the substrate table sub-system 15 into the projection sub-system 14. Furthermore, a control unit CU is provided, configured to determine a first suppression factor for the suppression system 20 for the tracer gas and to determine a second suppression factor for the suppression system 20 for the contaminant gas based on the first suppression factor. The control unit CU is arranged to receive information from the detection system DS about the amount of tracer gas TR that is detected in the projection sub-system 14. In an embodiment, the control unit CU may be arranged to receive information from and/or control the suppression system 20 and the tracer gas supply TS.

So, there is provided a lithographic apparatus as above, wherein the sub-system is a projection sub-system and the second sub-system is a substrate table sub-system.

Figure 7:
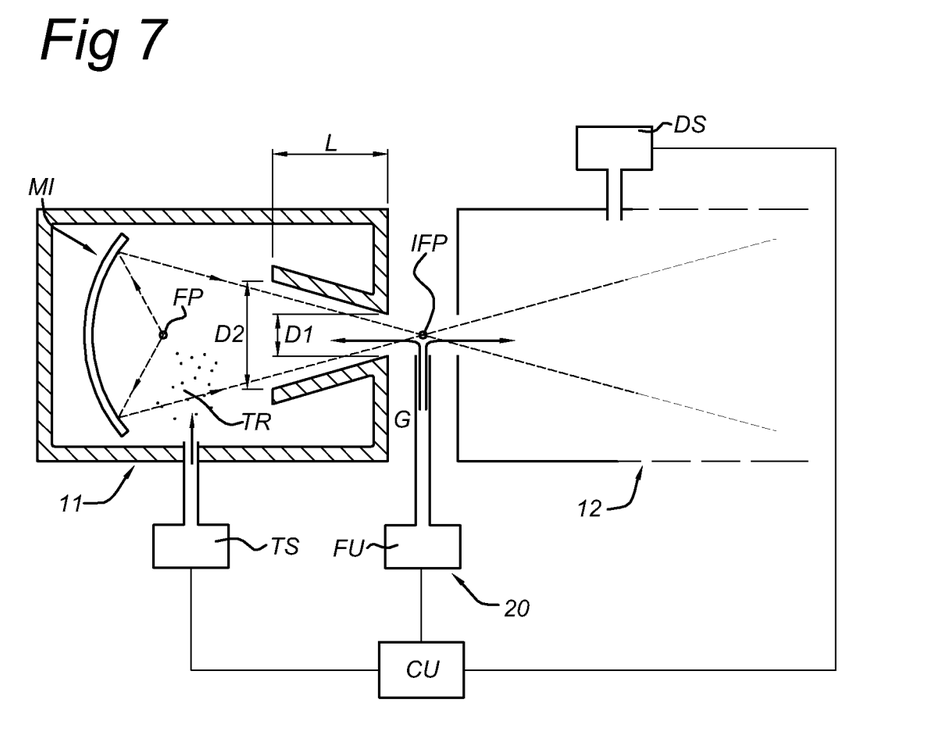
FIG. 7 schematically depicts a source sub-system with a suppression system according to an embodiment of the invention.

FIG. 7 schematically depicts a source sub-system 11 and an illumination sub-system 12, similar to FIG. 4, in which corresponding reference symbols indicate corresponding parts.

FIG. 7 further includes a tracer gas supply TS configured to introduce a tracer gas TR in the source sub-system 11. FIG. 6 further shows a detection system DS configured to detect the amount of tracer gas that has migrated out of the source sub-system 11 into the illumination sub-system 12. Furthermore, a control unit CU is provided, configured to determine a first suppression factor for the suppression system 20 for the tracer gas and to determine a second suppression factor for the suppression system 20 for the contaminant gas based on the first suppression factor. The control unit CU is arranged to receive information from the detection system DS about the amount of tracer gas TR that is detected in the projection sub-system 14. As an option, the control unit CU may be arranged to receive information from and/or control the suppression system 20 and the tracer gas supply TS.

So, there is provided a lithographic apparatus as above, wherein the sub-system is a source sub-system and the further sub-system is an illumination sub-system.

In general, there is provided a lithographic apparatus as described above, wherein the sub-system and the further sub-system as described above, are from a group including: a source sub-system configured to generate a radiation beam; an illumination sub-system configured to condition a radiation beam; a support structure sub-system constructed to support a patterning device, the patterning device being capable of imparting the radiation beam with a pattern in its cross-section to form a patterned radiation beam; a projection sub-system configured to project the patterned radiation beam onto a target portion of the substrate, and a substrate table sub-system constructed to hold a substrate.

Figure 8:
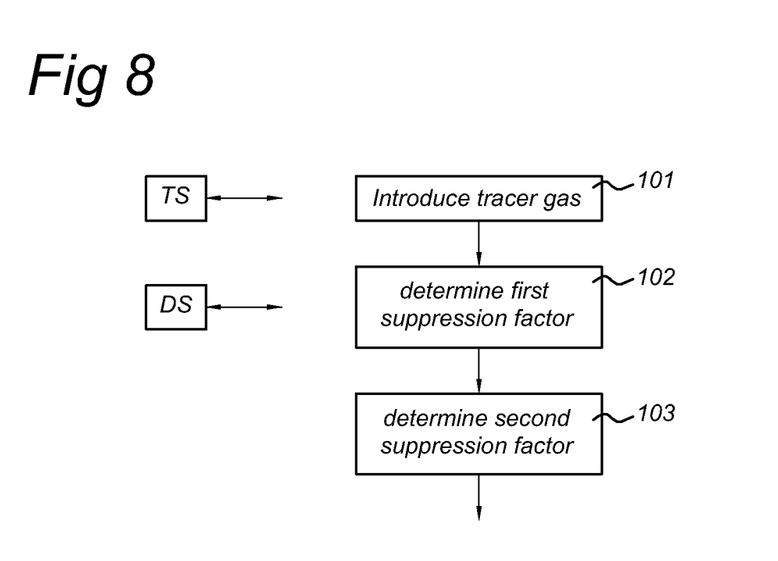
FIG. 8 schematically depicts a flow diagram according to an embodiment of the invention FIG. 9 schematically depicts a vacuum system according to an embodiment of the invention.

FIG. 8 schematically depicts a flow diagram that may be performed by the system as described above, in accordance with an embodiment of the invention. The flow diagram may be performed by a control unit CU as described above. As a first action 101, the method may include introducing a tracer gas TR in the first sub-system. As a second action 102, the method may include determining a first suppression factor for the suppression system for the tracer gas. Furthermore, the method may include a further action 103 in which a second suppression factor for the suppression system for the contaminant gas based on the first suppression factor is determined.

In an embodiment, there is provided a method for determining a suppression factor of a suppression system, where the suppression system is arranged to suppress migration of a contaminant gas out of a sub-system, the suppression factor being an indication of the performance of the suppression system, the method including introducing a tracer gas in the sub-system (101), providing a detection system configured to detect the amount of tracer gas that has migrated out of the sub-system, determining a first suppression factor for the suppression system for the tracer gas (102), and determining a second suppression factor for the suppression system for the contaminant gas based on the first suppression factor (103).

The system may very well be employed in a lithographic apparatus. According to an embodiment, a method is provided wherein the suppression system is provided in a lithographic apparatus and the suppression system is provided to prevent migration of the contaminant gas to a further sub-system of the lithographic apparatus. According to a further embodiment, the sub-system may be a source sub-system 11 and the further sub-system may be an illumination sub-system 12. According to a further embodiment, the sub-system may be a projection sub-system 14 and the second sub-system may be a substrate table sub-system 15.

The method may be performed by a control unit CU. The control unit CU may be a computer device including a processor having access to a memory, where the memory includes a computer program readable and executable by the processor to make the processor perform the embodiments described here. According to an embodiment, there is provided a computer program, when loaded on a computer arrangement, is arranged to perform any one of the methods described above. According to a further embodiment, there is provided a data carrier including such a computer program.

In an example, there is provided a tracer gas that is used to qualify the performance of the suppression system and to monitor the performance of the suppression system during operation.

According to this example, a source sub-system 11 and an illumination sub-system 12 are provided as shown in FIGS. 4 and 6. In the source sub-system 11, an aggressive chemical is present.

As this chemical is relatively aggressive, very low levels of it are allowed in the illuminator sub-system 12 and a suppression factor of $10^{10}$ may be desired.

First a suppression system is provided that provides (or is to provide) a suppression factor of $10^{10}$ or more. However, the available detection system is not allowed to check this suppression factor, as the amount of migrating through the suppression system is too low to be detected. Therefore a tracer gas is introduced in the source sub-system 11. The tracer gas is chosen to fulfill $$D_{tracer} \cdot Se_{tracer} > D_{cont} \cdot Se_{cont}$$

and such an amount of tracer gas is provided in the source sub-system 11 that with the specified suppression factor an amount of tracer gas should be detectable by the detection system. The amount of tracer gas may be chosen such that it is higher than the background level of the tracer gas already present and such that it is detectable by the detection system. Using the known diffusion coefficients of the tracer and the contaminant, the suppression factor of the suppression system for the contaminant can be determined.

The diffusion coefficient of the contaminant may be verified by testing a small part of the suppression system that has such a relatively low suppression factor that is measurable for the contaminant. The suppression factor may be proportional to the characteristic length of the suppression system. Therefore, for short suppression systems or, in other words, for a small part of the suppression system, the suppression factor may be low enough to have detectable amount of contaminant. Further, the diffusion constant may be verified by using a smaller flow than nominal.

Once the suppression system is qualified, the minimum tracer gas suppression factor is known that needs to be present in order to be sure about the suppression of the contaminant.

Before the contaminant is introduced in the source sub-system 11, a tracer gas level may be introduced in the source sub-system 11 and measure the suppression factor of the suppression system by measuring the level of the tracer gas in the illuminator sub-system 12. Only when it is detected that the suppression factor of the tracer is above the level found during the qualification, the contaminant flow is allowed.

Next, during operation of the source sub-system 11, an amount of tracer gas may be introduced in the source sub-system 11 continuously or on predetermined moments in time, to check the performance of the suppression system by measuring the amount of tracer gas present in the illuminator sub-system 12.

The above will be further explained by means of a calculation example.

The Péclet number for suppression of a contaminant with diffusion constant D, in a cone with start diameter D1 and end diameter D2, with a flow Q and with length L at a pressure p is $$P\acute{e} = \frac{Q}{p \cdot D} \cdot \frac{4 \cdot L}{\pi \cdot D1 \cdot D2}$$

as already described above. The suppression factor is given by $S = e^{P\acute{e}}$ One may find that the diffusion constants for a specific contaminant in a specific background gas equals 6.99 $m^2/s$ at a pressure of 1 Pa and a temperature of 300K and the diffusion constant of a tracer gas in the background gas equals 18.3 $m^2/s$ at a pressure of 1 Pa and a temperature of 300K.

When Q=0.38 Pa $m^3/s$; D1=0.006 m; D2=0.044 m; L=0.116 m; (p is arbitrary) it follows that

| Suppression factor | | |
|---|---|---|
| $S_{cont}$ | $1.65 \cdot 10^{13}$ | good enough for the protection of the illuminator but not detectable by the detection system |
| $S_{tracer}$ | $1.1 \cdot 10^{5}$ | detectable by the detection system |

Figure 9:
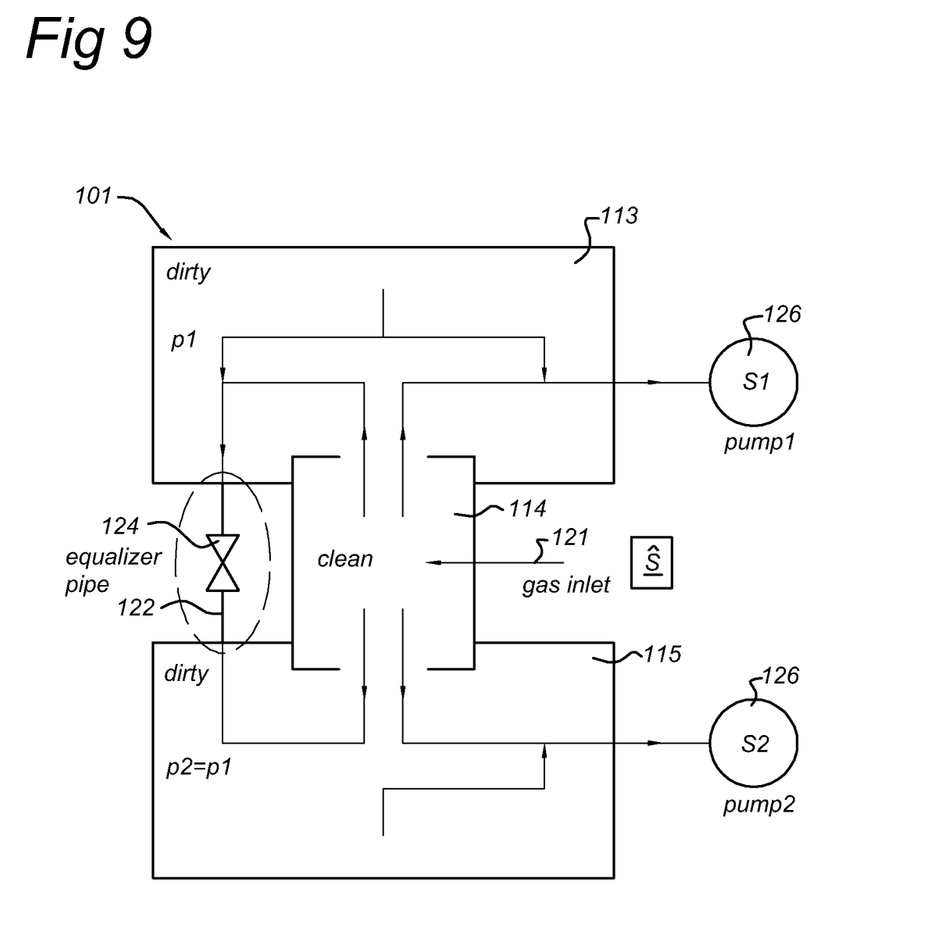

From the above it follows that a suppression system that maintains a suppression of the tracer gas by at least a factor of approximately $1.1 \cdot 10^5$, guarantees a suppression factor for the contaminant of approximately $1.6 \cdot 10^{13}$.

According to an embodiment, a first tracer gas may be used to qualify the performance of the suppression system, and a second tracer gas may be used to monitor the performance of the suppression system during operation. The specifications with respect to e.g. influence of the tracer gas on parts of the sub-systems of the second tracer gas may be different than the specifications of the first tracer gas, and may for instance be stricter, because monitoring may be done with the source switched on and the qualification may be done with the source switched off or in a system without a source.

According to an embodiment the second suppression factor, $S_{cont}$, is computed from the first suppression factor, $S_{tracer}$, by:

$$S_{cont} = S_{tracer}(D_{tracer}/D_{cont})$$

The embodiments described above were given in relation to a lithographic apparatus, and in particular to a first sub-system being a source sub-system 11 and a second sub-system being an illumination sub-system 12. However, it will be appreciated that the embodiments may also be used in between two other sub-systems within a lithographic apparatus. In fact, the embodiments may also be used in any other kind of system. In fact, any kind of system or sub-system having an open connection with the environment or second system or sub-system, including a suppression system to prevent migration of a gas from the system or sub-system to the environment of second s including a sub-system in which contaminants need to be confined.

The embodiments allow for better qualification of suppression systems such as gas locks. By using a tracer gas, the suppression system may be qualified and the qualification for the tracer gas may be translated into a relative accurate qualification of the performance of the suppression system for the contaminant that is to be suppressed.

Also, the embodiments allow monitoring the performance of the suppression system during operation or before a contaminant source is switched on.

FIG. 9 discloses a vacuum system 101 comprising a clean sub-system 114 and two further sub-systems 113, 115. In this embodiment of the vacuum system 101, the clean sub-system 114 may be provided with a gas inlet 121. The vacuum system also comprises a fluid connection 122 between further sub-system 113 and further sub-system 115. As shown in FIG. 9, the further fluid connection 122 by-passes the clean sub-system 115. Preferably, the further fluid connection has a conductance to gas flow which is higher than the conductance to gas flow of the clean sub-system. The vacuum system of FIG. 9 may, for instance, be implemented in the lithographic apparatus of FIG. 2. The further sub-system 113 may be the support structure sub-system 13 and the further sub-system 115 may be the substrate table sub-system 14. The clean sub-system 114 may be the projection sub-system 15.

Returning to FIG. 9, the further fluid connection 122 may comprise a valve 124 arranged to open and close the further fluid connection 122. Additionally or alternatively, the vacuum system may comprise two pumps 126, each arranged to evacuate one of the further sub-systems 113, 115 by pumping gas present in the further sub-system along a flow path substantially away from the clean sub-system 114. A further control unit Ŝ may be provided configured to control one or more of the pumps, in this embodiment one or both of the pumps 126. The further control unit Ŝ may also by configured to control the valve 124 to open and/or close.

In normal operation, a non-contaminating gas may be provided through the gas inlet 121. A pressure in the clean sub-system 114 may be higher than the pressure in the sub-systems 113, 115.

During evacuation of the, the one or more of the further sub-systems 113, 115 by pumping gas along a flow path substantially away from the clean sub-system 114 may be evacuated. By opening the valve 124, a further flow is provided between further sub-system 113 and further subsystem 115. Any pressure differential created by evacuation of one of the further sub-systems 113, 115 by the pumps will be compensated by flow through the clean sub-system 114 and/or the further fluid connection 122. Contamination of the clean sub-system 114 may be avoided by diverting the flow through the further fluid connection 122. The higher the flow conductance of the fluid connection 122 with respect to the flow conductance of the clean sub-system 114, the more flow is diverted by the fluid connection 122.

Figure 10:
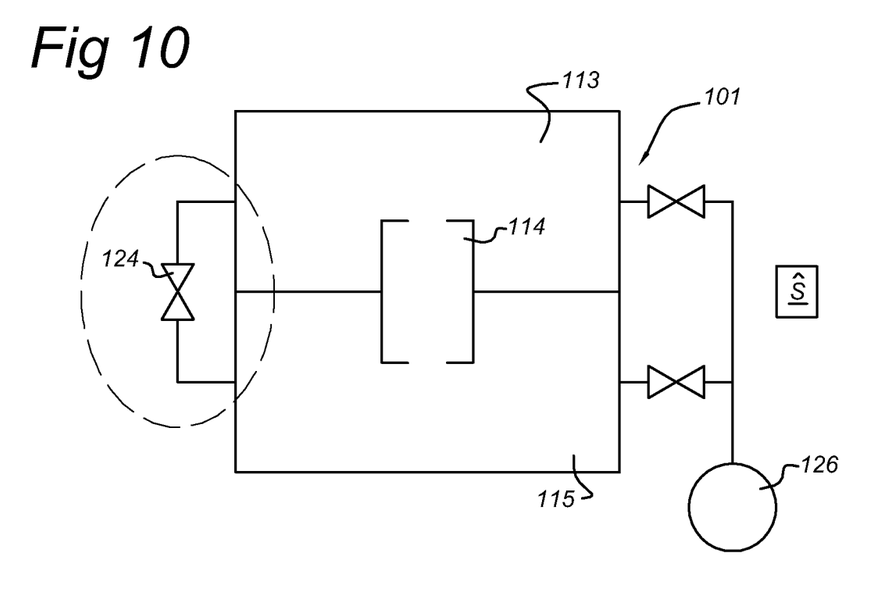
FIG. 10 schematically depicts a further vacuum system according to an embodiment of the invention.

FIG. 10 depicts another embodiment of the vacuum system 101. In this embodiment, only one pump 126 is provided. However, by selectively opening additional valves 128, it is possible to adjust the vacuum system such that a predetermined further sub-system 113, 115 is evacuated. The control unit $\hat{S}$ is configured to open and close the valves 128.

Figure 11:
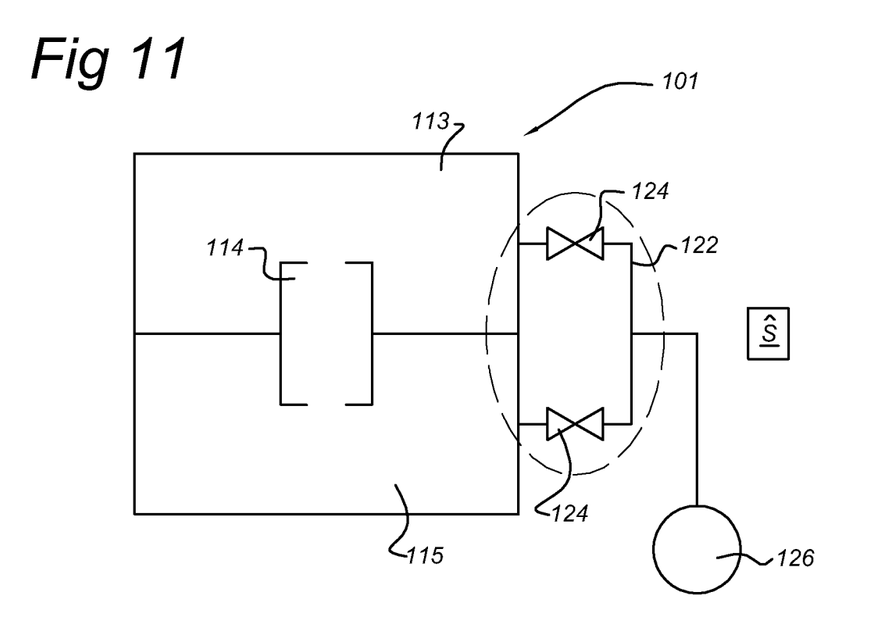
FIG. 11 schematically depicts a yet a further vacuum system according to an embodiment of the invention.

FIG. 11 depicts yet another embodiment of the vacuum system 101. In the embodiment of FIG. 11, the further fluid connection 122 itself is also in fluid connection with the pump 126. By opening both valves 128, the fluid connection 122 is opened thereby by-passing the clean sub-system 114.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium or a computer readable medium (e.g. semiconductor memory, magnetic or optical disk) having such a computer program stored therein.

The descriptions above are intended to be illustrative, not limiting. Thus, it will be appreciated by one skilled in the art that modifications may be made to the invention as described without departing from the scope of the claims set out below.

What is claimed is:

1. A method for determining a suppression factor of a suppression system, the suppression system arranged to suppress migration of a contaminant gas out of a first system, the suppression factor being an indication of the performance of the suppression system, the method comprising:
introducing a tracer gas in the first system;
detecting an amount of the tracer gas that has migrated out of the first system;
determining a first suppression factor for the suppression system for the tracer gas; and
determining a second suppression factor for the suppression system for the contaminant gas based on the first suppression factor,
wherein the second suppression factor, $S_{cont}$, is computed from the first suppression factor, $S_{tracer}$, by:

$$S_{cont}=S_{tracer}(D_{tracer}/D_{cont})$$

where $D_{tracer}$ is the diffusion coefficient of the tracer gas and $D_{cont}$ is the diffusion coefficient of the contaminant gas.

2. The method according to claim 1, wherein the suppression system is a gas lock.

3. The method according to claim 1, wherein the suppression system is provided in a lithographic apparatus and the suppression system is provided to prevent migration of the contaminant gas to a second system of the lithographic apparatus.

4. The method according to claim 3, wherein the first system is a source sub-system and the second system is an illumination sub-system.

5. The method according to claim 3, wherein the first system is a substrate table sub-system and the second system is a projection sub-system.

6. The method according to claim 1, wherein the diffusion coefficient of the tracer gas is greater than the diffusion coefficient of the contaminant gas: $D_{tracer} > D_{cont}$.

7. The method according to claim 1, wherein the tracer gas is better detectable by the detection system than the contaminant gas: $Se_{tracer} > Se_{cont}$.

8. The method according to claim 1, wherein the suppression system has a detectability for the tracer gas $Se_{tracer}$ and the suppression system has a detectability for the contaminant gas $Se_{cont}$ and $$D_{tracer} \cdot Se_{tracer} > D_{cont} \cdot Se_{cont}$$

9. The method according to claim 1, wherein the tracer gas is a noble gas.

10. The method according to claim 1, wherein the tracer gas is formed by isotopes of gases that are already present in the first system and includes hydrogen enriched with deuterium or tritium.

11. A system comprising a first system and a suppression system arranged to suppress migration of a contaminant gas out of the first system, the suppression system having a suppression factor being an indication of the performance of the suppression system, the system further comprising:

a tracer gas supply configured to introduce a tracer gas in the first system;

a detector system configured to detect an amount of the tracer gas that has migrated out of the first system; and a control unit configured to determine a first suppression factor for the suppression system for the tracer gas and to determine a second suppression factor for the suppression system for the contaminant gas based on the first suppression factor, wherein the second suppression factor, $S_{cont}$, is computed from the first suppression factor, $S_{tracer}$, by:

$$S_{cont}=S_{tracer}(D_{tracer}/D_{cont})$$

where $D_{tracer}$ is the diffusion coefficient of the tracer gas and $D_{cont}$ is the diffusion coefficient of the contaminant gas.

12. The system according to claim 11, wherein the suppression system is a gas lock.

13. The system according to claim 11, wherein the diffusion coefficient of the tracer gas is greater than the diffusion coefficient of the contaminant gas: $D_{tracer}>D_{cont}$.

14. The system according to claim 11, wherein the tracer gas has a higher detectability than the contaminant gas: $Se_{tracer}>Se_{cont}$.

15. The system according to claim 11, wherein the suppression system has a detectability for the tracer gas $Se_{tracer}$ and the suppression system has a detectability for the contaminant gas $Se_{cont}$ and $$D_{tracer} \cdot Se_{tracer} > D_{cont} \cdot Se_{cont}$$

16. The system according to claim 11, wherein the tracer gas is a noble gas.

17. The system according to claim 11, wherein the tracer gas is formed by isotopes of gases that are already present in the sub-system and includes hydrogen enriched with deuterium or tritium.

18. A lithographic apparatus comprising:

a first system and a suppression system arranged to suppress migration of a contaminant gas out of the first system, the suppression system having a suppression factor being an indication of the performance of the suppression system;

a tracer gas supply configured to introduce a tracer gas in the first system;

a detector system configured to detect an amount of the tracer gas that has migrated out of the first system; and a control unit configured to determine a first suppression factor for the suppression system for the tracer gas and to determine a second suppression factor for the suppression system for the contaminant gas based on the first suppression factor, wherein the second suppression factor $S_{cont}$, is computed from the first suppression factor, $S_{tracer}$, by:

$$S_{cont}=S_{tracer}(D_{tracer}/D_{cont})$$

where $D_{tracer}$ is the diffusion coefficient of the tracer gas and $D_{cont}$ is the diffusion coefficient of the contaminant gas;

wherein the suppression system is provided to prevent migration of the contaminant gas to a second system of the lithographic apparatus.

19. The lithographic apparatus according to claim 18, wherein the first system is a source sub-system and the second system is an illumination sub-system.

20. The lithographic apparatus according to claim 18, wherein the first system is a substrate table sub-system and the second system is a projection sub-system.

21. The lithographic apparatus according to claim 18, wherein the first system and the second system are from a group comprising:

a source sub-system configured to generate a radiation beam, an illumination sub-system configured to condition the radiation beam;

a support structure sub-system constructed to support a patterning device, the patterning device being capable of imparting the radiation beam with a pattern in its cross-section to form a patterned radiation beam;

a projection sub-system configured to project the patterned radiation beam onto a target portion of a substrate, and a substrate table sub-system constructed to hold the substrate.

22. A non-transitory computer-readable medium having machine executable instructions, the instructions being executable by a machine to perform a method for determining a suppression factor of a suppression system, the suppression system arranged to suppress migration of a contaminant gas out of a first system, the suppression factor being an indication of the performance of the suppression system, the method comprising:

introducing a tracer gas in the first system;

detecting an amount of the tracer gas that has migrated out of the first system;

determining a first suppression factor for the suppression system for the tracer gas; and determining a second suppression factor for the suppression system for the contaminant gas based on the first suppression factor, wherein the second suppression factor, $S_{cont}$, is computed from the first suppression factor, $S_{tracer}$, by:

$$S_{cont}=S_{tracer}(D_{tracer}/D_{cont})$$

where $D_{tracer}$ is the diffusion coefficient of the tracer gas and $D_{cont}$ is the diffusion coefficient of the contaminant gas.

* * * * *